US007956668B2

(12) United States Patent
Wilson et al.

(10) Patent No.: US 7,956,668 B2
(45) Date of Patent: Jun. 7, 2011

(54) SPECTRAL PREDICTIVE SWITCHING DEVICE ACTIVATION (76) Inventors: Kevin Wilson, Lake Forest, CA (US); John Baggs, San Bernardino, CA (US); Louis Couture, Santa Barbara, CA (US)

( * ) Notice: Subject to any disclaimer, the term of this patent is extended or adjusted under 35 U.S.C. 154(b) by 815 days.

(21) Appl. No.: 11/950,253

(22) Filed: Dec. 4, 2007

(65) Prior Publication Data

US 2008/0150651 A1  Jun. 26, 2008

Related U.S. Application Data (60) Provisional application No. 60/871,100, filed on Dec. 20, 2006.

(51) Int. Cl.
  *H03K 17/00* (2006.01)
(52) U.S. Cl. ......... 327/365; 327/427; 327/436; 327/437
(58) Field of Classification Search .................. 327/365, 327/427, 436, 437
  See application file for complete search history.

(56) References Cited

U.S. PATENT DOCUMENTS

| | | |
|---|---|---|
| 3,582,560 A | 6/1971 | Banks et al. |
| 4,983,961 A | 1/1991 | Brunle et al. |
| 5,329,520 A | 7/1994 | Richardson |
| 5,479,608 A | 12/1995 | Richardson |
| 5,787,085 A | 7/1998 | Fox |
| 5,790,519 A | 8/1998 | Hanson et al. |
| 5,982,746 A | 11/1999 | Hanson et al. |
| 6,069,540 A | 5/2000 | Berenz et al. |
| 6,166,571 A * | 12/2000 | Wang .............................. 327/115 |
| 6,335,992 B1 | 1/2002 | Bala et al. |
| 6,388,359 B1 | 5/2002 | Duelli et al. |
| 6,433,595 B1 * | 8/2002 | Tung et al. ..................... 327/115 |
| 6,535,663 B1 | 3/2003 | Chertkow |
| 6,653,929 B1 | 11/2003 | Hu et al. |
| 6,696,917 B1 | 2/2004 | Heitner et al. |
| 6,707,727 B2 * | 3/2004 | Tamura et al. ................ 365/192 |
| 6,785,038 B2 | 8/2004 | Hichwa et al. |
| 6,879,429 B2 | 4/2005 | Wong et al. |
| 6,904,191 B2 | 6/2005 | Kubby |
| 6,917,224 B2 * | 7/2005 | Han .............................. 327/105 |
| 6,947,624 B2 | 9/2005 | Kubby |
| 2005/0157713 A1 | 7/2005 | Klausmeier et al. |
| 2006/0126610 A1 | 6/2006 | Ryan et al. |
| 2008/0151910 A1 | 6/2008 | Wilson et al. |

OTHER PUBLICATIONS

Jajzczyk, 50 Years of Clos Networks a Survey of Research Issues (online), HPSR 2003 [retrieved on Jun. 6, 2008] retrieved from the internet:<url: http://www.tlc-networks.polito.it/HPSR2003/talks/Clos_HPSR_AJ.pdf> entire document.

(Continued)

*Primary Examiner* — Kenneth B. Wells
(74) *Attorney, Agent, or Firm* — Greenberg Traurig LLP; Franklin D. Ubell (57) ABSTRACT A method of driving an array of switches comprising supplying the same drive signal to a first drive terminal of a plurality of the switches of an array and supplying second drive signals to a second drive terminal of each of the plurality of switches, the second drive signal supplied to a first of the switches being of a form selected to close the first switch, the form of the second drive signal supplied to the remaining switches being selected to prevent false activation of those switches.

18 Claims, 7 Drawing Sheets

OTHER PUBLICATIONS

Kim et al., Adaptive Routing in High-Radix Clos Network. [online], Nov. 2006 [retrieved on Jun. 6, 2008], retrieved from the internet<url:http://cva.stanford.edu/publications/2006/SC_adaptive.pdf>. entire document especially the Abstract; Introduction, Fig 1.

Yang, et al., Wide-Sense Nonblocking Clos Networks under Packing Strategy. [online], 1997 [retrieved on Jun. 6, 2008], retrieved from the Internet: <url:http://ipdps.cc.gatech.edu/1997/s2/112.pdf.. entire document.

Form PCT/ISA/220; International Search Report in connection with PCT/US2007/087604 dated Jun. 24, 2008.

Form PCT/ISA/237; Written Opinion of the International Searching Authority in connection with PCT/US2007/087604 dated Jun. 24, 2008.

* cited by examiner

SPECTRAL PREDICTIVE SWITCHING DEVICE ACTIVATION

RELATED APPLICATIONS

This application claims the Paris Convention priority of U.S. Provisional Application No. 60/871,100 entitled "Spectral Predictive Switching Device Activation," filed Dec. 20, 2006, the contents of which are hereby incorporated by reference in their entirety.

FIELD OF INVENTION

The invention relates generally to a method and apparatus for driving an array of switching devices and more particularly to a method and apparatus for selectively driving a matrix array of electromechanical bi-stable devices (EM devices) with a greatly reduced number of coil drivers.

DESCRIPTION OF RELATED ART

Present methods for driving large arrays of electromechanical ("EM") bi-stable devices require a discrete driver on one side of each coil and a common driver on the common side of a series of coils. If an array of coils consists of an N dimension and M dimension, the total number of drivers is N*M+N (or N*M+M, which ever is less).

One consideration in designing drive circuitry for selectively driving an array of electromechanical devices is that the devices do not exhibit sufficiently close tolerance of activation EMF to prevent activation of parasitic coils that are connected in series/parallel to the specific EM device, which it is desired to activate. The conventional approach to accommodating this design consideration is to provide separate coil drives to eliminate the parasitic coil connections, which results in the total number of drivers described above.

SUMMARY

Implementation of the switching device activation approach illustrated by the embodiments described below allows the elimination of discrete drivers by counter driving the coils of parasitic EM devices with pulse modulated electromotive force (EMF) to counteract the sympathetic switching of nearby devices. According to an illustrative embodiment, the EMF duty cycle and polarity applied to the parasitic paths is determined by the tolerance of switching EMF and the proximity of the sympathetic EM device to the targeted device within a matrix array. The result is that the EM devices in the parasitic paths are not switched for either possible initial state and the total number of drivers required for large arrays of EM devices such as, for example, relays and solenoids, is greatly reduced.

Methods according to the illustrative embodiments are effective in addressing EM device arrays that are symmetric (N=M), asymmetric (N>M or N<M), or asymmetric plus non orthogonal (an array composed of multi asymmetric sub arrays with various N or M segments).

DETAILED DESCRIPTION

Figure 1:
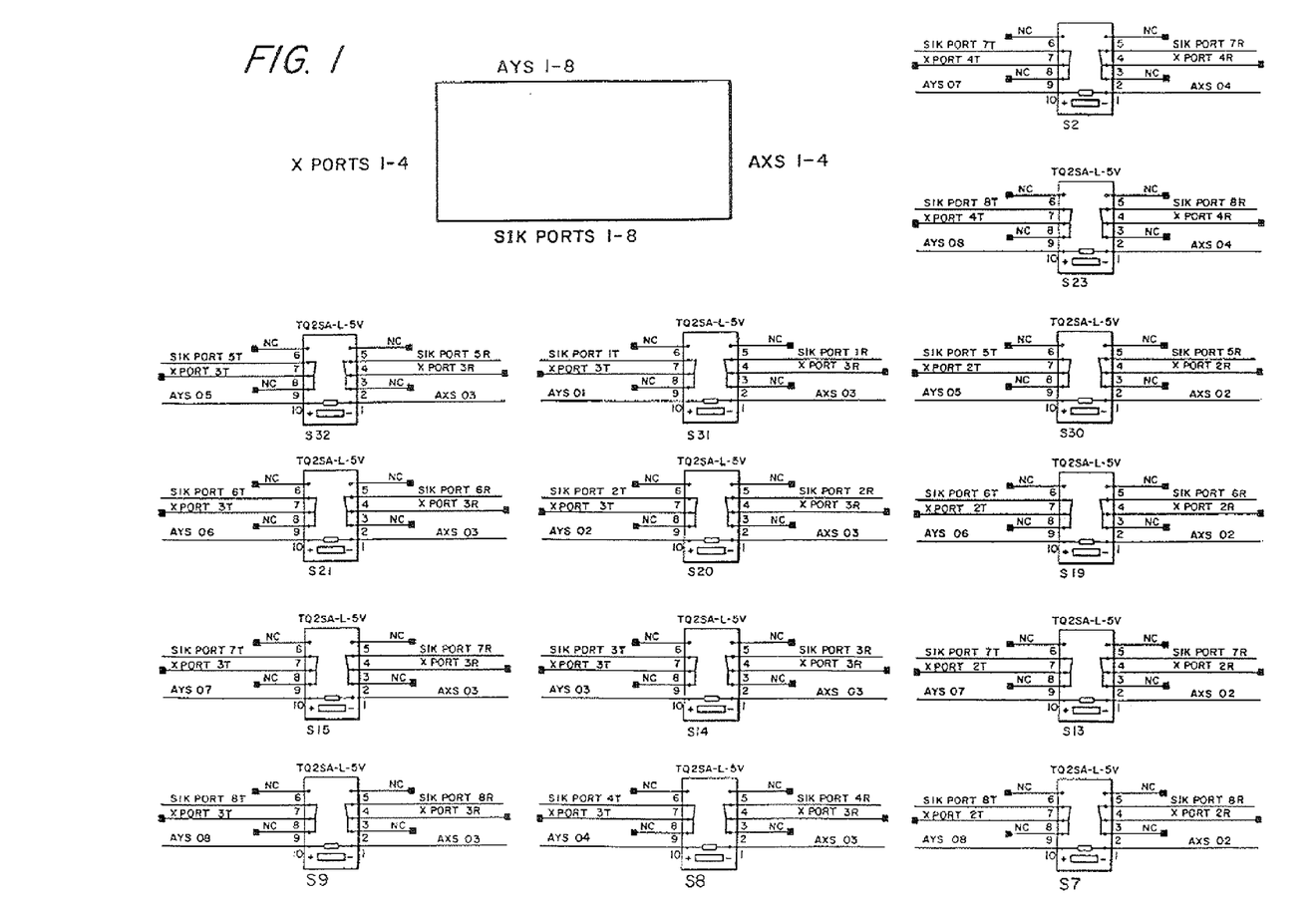
FIGS. 1 and 2 comprise a schematic circuit diagram of an array of 32 switches according to an illustrative embodiment.
Figure 2:
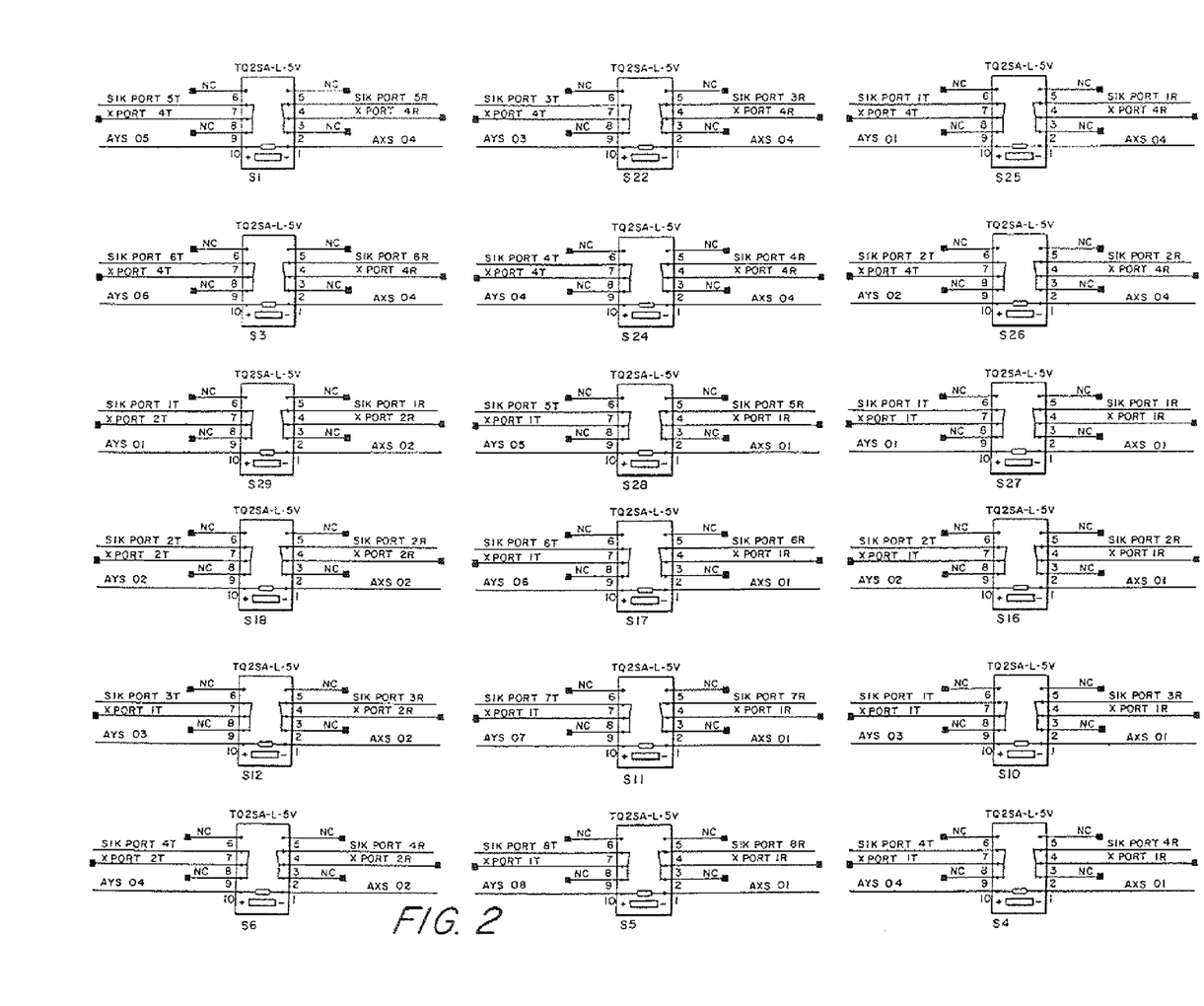

FIGS. 1 and 2 depict an array of 32 switching devices $S_1$, $S_2$, $S_3$ . . . $S_{32}$. The particular switching devices depicted are cantilever MEMS switches, but could be other types of switches or relays in other embodiments.

Each of the switches $S_1$ . . . $S_{32}$ includes an activation coil (e.g. 21 in FIG. 5), having positive ("Y") and negative ("X") terminals. According to the illustrative embodiment, eight positive terminal drivers and four negative terminal drivers suffice to switch ("close") any selected one of the 32 switching devices $S_1$ . . . $S_{32}$. The eight positive drivers produce respective drive signals, AYS_01, AYS_02, AYS_03 . . . AYS_08; while the four negative drivers produce four respective drive signals AXS_01, AXS_02, AXS_03 and AXS_04.

Figure 3:
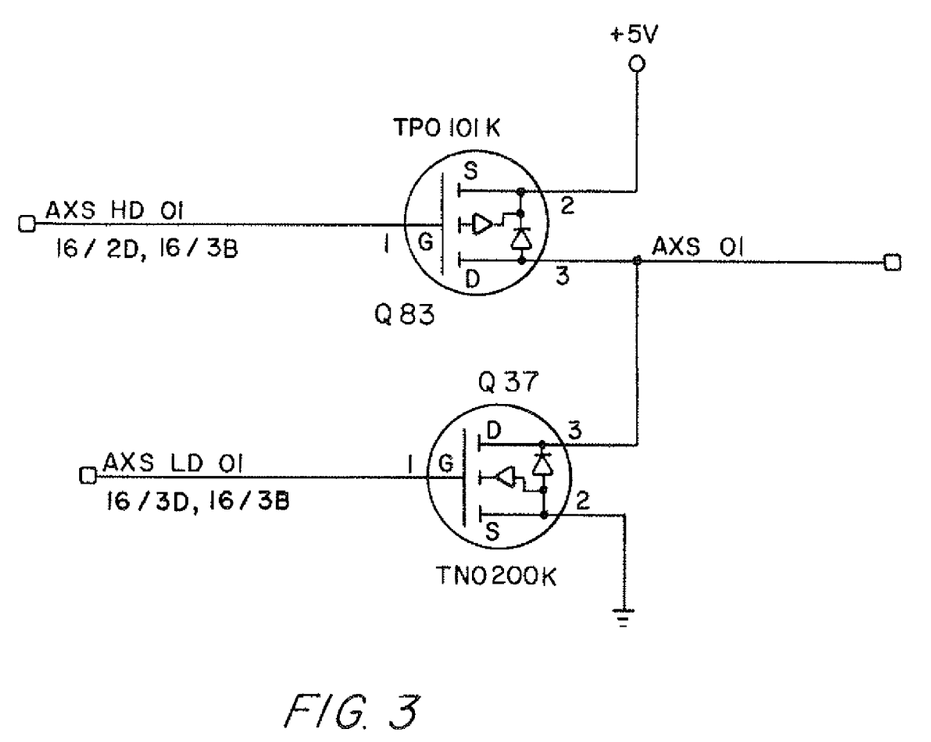
FIGS. 3 and 4 are circuit diagrams of driver circuits employed in the illustrative embodiment.
Figure 4:
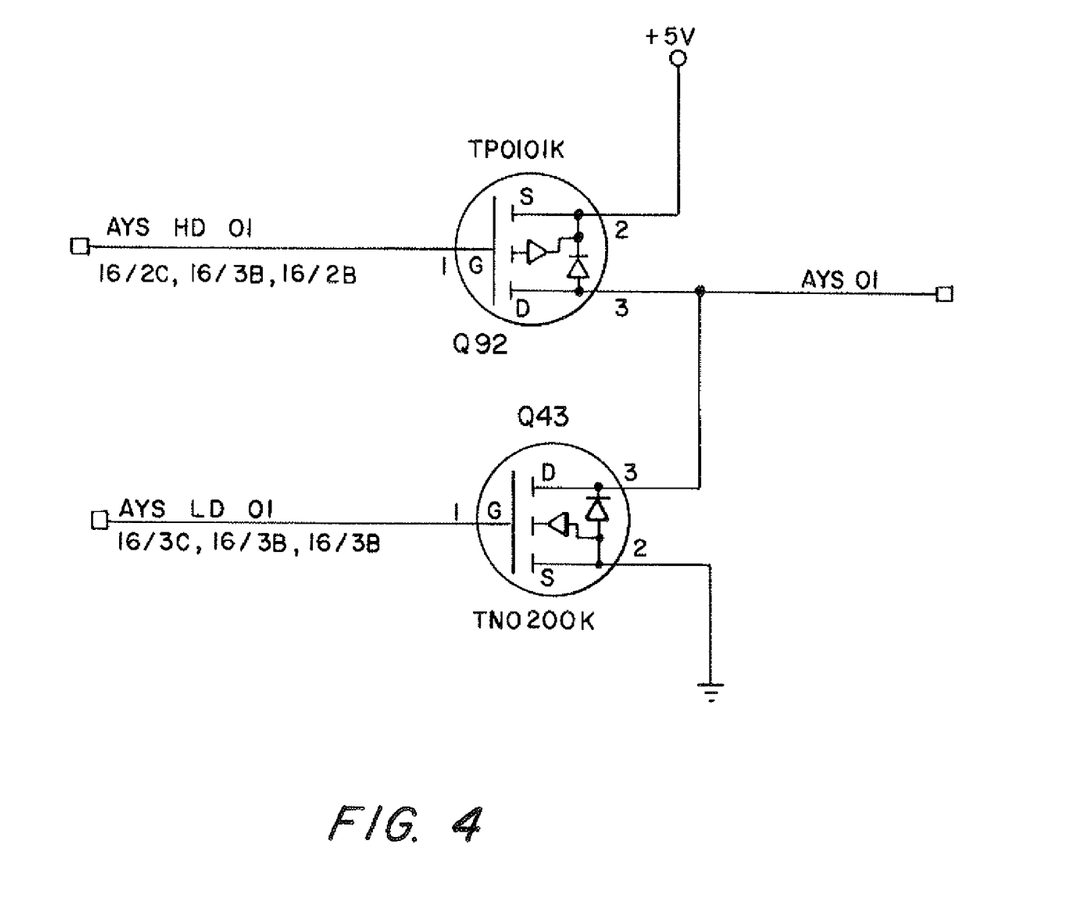

FIGS. 3 and 4 depict a driver circuit for generating drive signals AXS_01 and AYS_01, respectively. These driver circuits may be conventional MOSFET drivers. The driver of FIG. 3 is triggered by gate signals AXS_HD_01 and AXS_LD_01, while that of FIG. 4 is triggered by gates signals AYS_HD_01 and AYS_LD_01.

Figure 5:
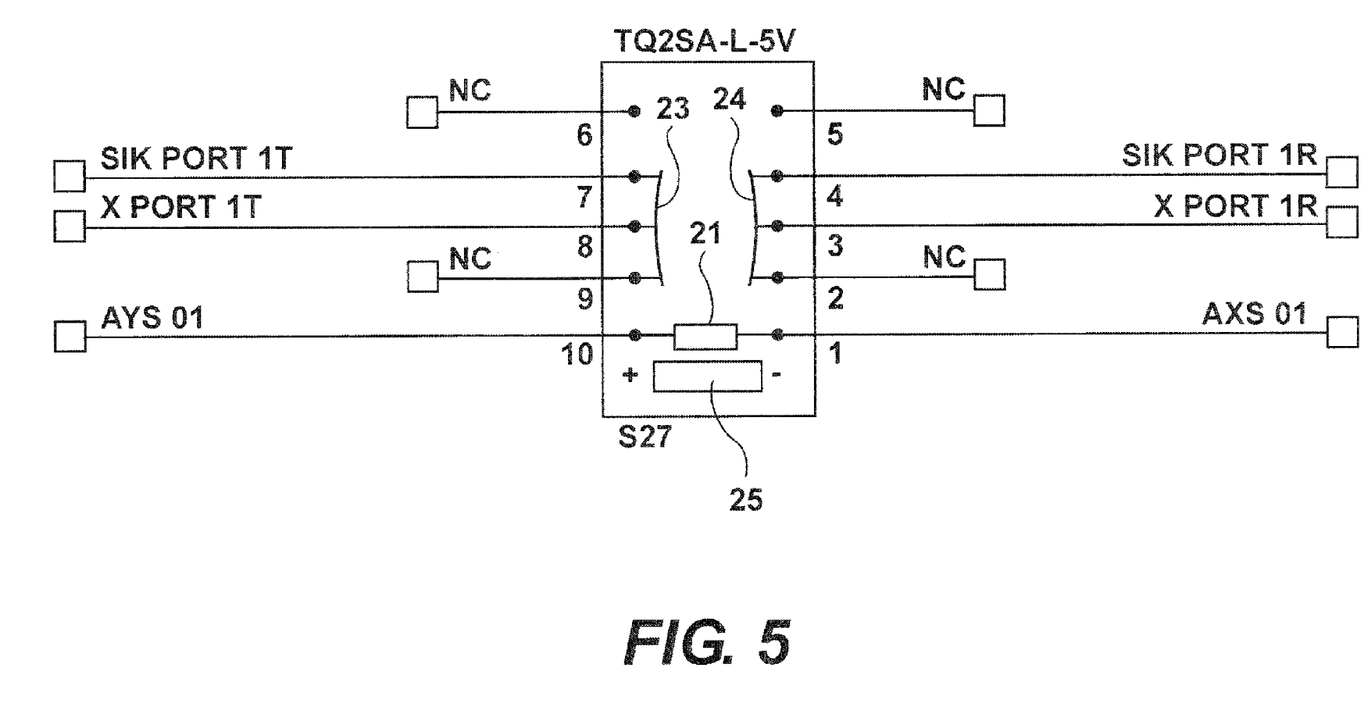
FIG. 5 is an enlarged view of one of the switches of the array of FIGS. 1 and 2.

A specific MEMS switching device $S_{27}$ is shown enlarged in FIG. 5. It may be seen that the coil 21 of this device $S_{27}$ is driven by drive signals AYS_01 and AXS_01. Pins 7 and 4 are "signal-in" pins and pins 8 and 3 are "signal returns," respectively. The temporary magnetic field created by an energy pulse to the coil 21 starts the respective cantilevers 23, 24 to pull and close the respective signal paths. The cantilevers 23, 24 are held in place by a fixed magnet 25 after the activation pulse to the coil 21 terminates.

Figure 6:
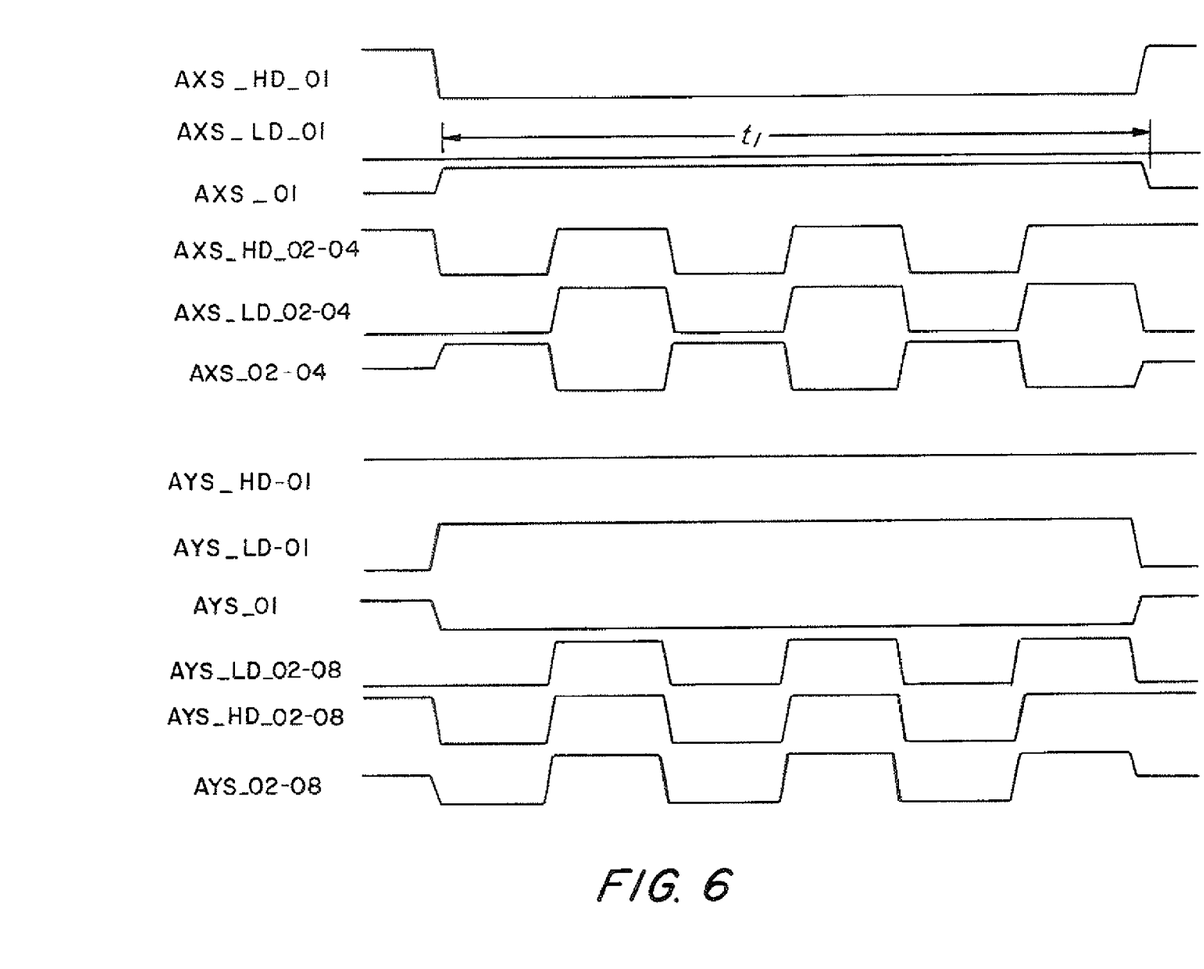
FIGS. 6 and 7 are waveform diagrams useful in illustrating operation of the illustrative embodiment.

FIG. 6 illustrates the pulse waveforms utilized when it is desired to set switch $S_{27}$, i.e. close cantilevers 23, 24. As may be seen AXS_01 rises to a constant positive voltage level for a time interval $t_1$, which may be for example, 200 microseconds. At the same time AYS_01 drops to a constant negative voltage level over the same interval $t_1$. The other "X" drive signals AXS_02, AXS_03 and AXS_04 are pulsed with a periodic pulse train which alternates between a positive and a negative voltage level. The other "Y" drive signals AYS_02-08 are driven with a pulse train which may be the same as, but opposite in polarity, to that driving AXS_02-04.

In this manner, only switch S27 is provided with the energy necessary to activate or "close" it, while the pulse modulated energy prevents false triggering of other switching devices in the array. As may be appreciated, three other switches in $S_{25}$, $S_{29}$, $S_{31}$ in the 32 switch array of FIGS. 1 and 2 are driven by the output AYS_01 of the driver circuit shown in FIG. 4. I-however, each of these other switches receives a respective one of the modulated "X" drive signals AXS_02, AXS_03 and AXS_04, which prevents triggering of these three switches $S_{25}$, $S_{29}$, $S_{31}$.

Figure 7:
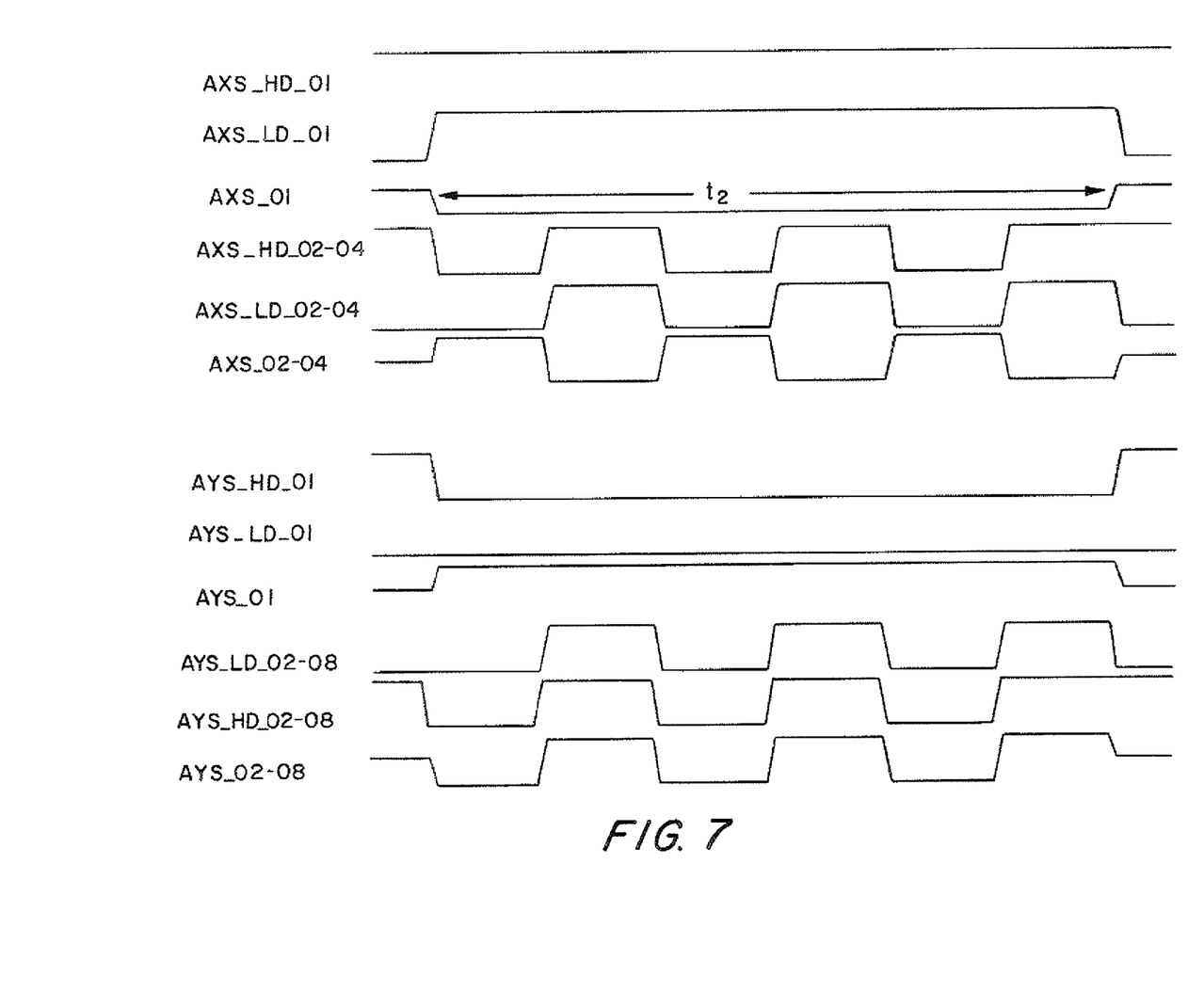

To clear or reset switch $S_{27}$, the energy waveforms depicted in FIG. 7 are used. In this case, AXS_01 comprises a negative pulse of duration $t_2$, while AYS_01 comprises a positive pulse of duration $t_2$. The waveforms for AXS_02-04 and AYS_02-08 are the same as those of FIG. 6; thus achieving the resetting of switch $S_{27}$ without false triggering of other switches in the array.

With respect to switch $S_{27}$, the pulse interval and voltage level supplied by AXS_01 and AYS_01 may be those typically necessary to close the switch. Such levels and durations will typically vary depending on the type of switch used, e.g. MEMS switches or electromechanical relays or solenoids. Additionally, the voltage levels and duty cycle of the pulse modulated waveforms, e.g. AXS_02, AXS_03, AXS_04 in FIG. 6, will vary with the application, but are selected in each application to be sufficient to prevent false triggering of other devices in the array. Waveforms analogous to those shown in FIGS. 6 and 7 are used to set and reset any specific one of the other switches in the 32 switch array. With respect to the array of FIGS. 1 and 2, it may be observed that such an array would conventionally require 4×8+4 (N·M+N)=36 drivers, whereas the illustrative embodiment employs 12 drivers.

Those skilled in the art will appreciate that various adaptations and modifications of the just described preferred embodiment can be configured without departing from the scope and spirit of the invention. Therefore, it is to be understood that, within the scope of the appended claims, the invention may be practiced other than as specifically described herein.

What is claimed is:

1. A method of driving an array of electromechanical switches comprising:
   supplying the same drive signal to a first drive terminal of a plurality of electromechanical switches of said array; and
   supplying second drive signals to a second drive terminal of each of said electromechanical switches, a first of the second drive signals supplied to a first of said switches being of a form selected to close said first switch, the form of a second of the second drive signals being supplied to the remaining switches of said plurality being selected to prevent false activation or false closing of said remaining switches.

2. The method of claim 1 wherein the duty cycle and polarity of said second drive signal supplied to said remaining switches are selected to prevent said false activation.

3. An apparatus comprising:
   a plurality of electromechanical switches, each having first and second drive terminals;
   a first driver for supplying a first drive signal to each of said first drive terminals;
   a second driver for supplying a second drive signal to the second drive terminal of a first of said plurality of switches, said first and second drive signals being of a form selected to close said first of said plurality of switches; and
   a third driver for supplying a third drive signal to the second drive terminal of a second of said plurality of switches, said third drive signal being of a form selected to prevent closing of said second of said plurality of switches.

4. The apparatus of claim 3 wherein said first drive signal has a waveform which rises to a constant positive voltage level over a first interval, wherein said second drive signal has a waveform which drops to a constant negative voltage level during the first interval, and wherein said third drive signal comprises a pulse train which alternates between a positive and a negative voltage level during said first interval.

5. The apparatus of claim 4 wherein said first and second drivers are further actuable to clear or reset the first switch by supplying fourth and fifth drive signals thereto, said fourth drive signal comprising a negative voltage level over a second interval while said fifth drive signal comprises a positive voltage level during said second interval, and wherein said third driver is actuable to supply a sixth drive signal during said second interval, said sixth drive signal comprising a pulse train which alternates between a positive and negative voltage level during said second interval.

6. An apparatus comprising:
   a plurality of switches, each having first and second drive terminals;
   each switch comprising a conductive coil configured to receive respective signals applied to said first and second drive terminals;
   a first driver being actuable to supply a first drive signal to each of said first drive terminals;
   a second driver actuable to supply a second drive signal to the second drive terminal of a first of said plurality of switches, said first and second drive signals being of a form selected to cause said coil to close or initiate closing of said first of said plurality of switches; and
   a third driver actuable to supply a third drive signal to the second drive terminal of a second of said plurality of switches, said third drive signal being of a form selected to prevent closing of said second of said plurality of switches.

7. The apparatus of claim 6 wherein said first drive signal has a waveform which rises to a constant positive voltage level over a first interval, while at the same time, said second drive signal has a waveform which drops to a constant negative voltage level during the same interval, and wherein said third drive signal comprises a pulse train which alternates between a positive and a negative voltage level during said interval.

8. The apparatus of claim 7 wherein, said first and second drivers are further actuable to clear or reset the first switch by supplying respective fourth and fifth drive signals to the first switch, said fourth drive signal comprising a negative voltage level over a second interval while said fifth drive signal comprises a positive voltage level during said second interval, and wherein said third driver is actuable to provide a sixth drive signal comprising a pulse train which alternates between a positive and negative voltage level during said second interval.

9. The apparatus of claim 6 wherein each switch further comprises a pair of electrical contacts and a member configured to move so as to create a conductive path between said pair of contacts, and wherein said coil, in response to application of said first and second drive signals, generates a magnetic field which causes said member to move and create said conductive path.

10. The apparatus of claim 6 wherein said plurality of switches includes a third switch and wherein said third driver is further actuable to supply said third drive signal to a second drive terminal of said third switch, said third drive signal being of a form selected to also prevent closing of said third switch.

11. The apparatus of claim 10 wherein said plurality of switches includes a fourth switch and wherein said third driver is further actuable to supply said third drive signal to a second drive terminal of said fourth switch, said third drive signal being of a form selected to also prevent closing of said fourth switch.

12. The switching array of claim 6 wherein said third drive signal prevents sympathetic parasitic switching of said second of said plurality of switches.

13. A switching array comprising:
   a plurality of switches, each having first and second drive terminals wherein each of said switches comprises a magnetic field generating device capable of generating a magnetic field of sufficient strength to close or initiate closing of the respective switch;
   a first driver actuable to supply a first drive signal to each of said first drive terminals;
   a second driver actuable to supply a second drive signal to the second drive terminal of a first of said plurality of switches, wherein said first and second drive signals are of a form selected to cause said magnetic field generating device to close or initiate closing of said first of said plurality of switches; and a third driver actuable to supply a third drive signal to the second drive terminal of a second of said plurality of switches, said third drive signal being of a form selected to prevent the magnetic field generating device of said second of said plurality of switches from generating a magnetic field of sufficient strength to close or initiate closing of said second of said plurality of switches.

14. The array of claim 13 wherein the first drive signal has a polarity opposite to that of said second drive signal.)

15. The switching array of claim 13 wherein said third drive signal prevents sympathetic parasitic switching of said second of said plurality of switches.

16. A method of driving an array of switches comprising:
supplying the same first drive signal to a first drive terminal of each of a plurality of switches of said array wherein said first drive signal has a waveform which rises to a constant positive voltage level over a first interval;
supplying a second drive signal to a first of said switches, said second drive signal having a waveform which drops to a constant negative voltage level during the first interval; and
supplying a third drive signal to the remaining switches of said plurality of switches, said third drive signal being selected to prevent false activation of said remaining switches and comprising a pulse train which alternates between a positive and a negative voltage level during said first interval.

17. An apparatus comprising:
a plurality of switches, each having first and second drive terminals;
a first driver for supplying a first drive signal to each of said first drive terminals, the first drive signal having a waveform which rises to a constant positive voltage level over a first interval;
a second driver for supplying a second drive signal to the second drive terminal of a first of said plurality of switches, said first and second drive signals being of a form selected to close said first of said plurality of switches, and said second drive signal having a waveform which drops to a constant negative voltage level during the first interval; and
a third driver for supplying a third drive signal to the second drive terminal of a second of said plurality of switches, said third drive signal comprising a pulse train having a waveform selected to prevent closing of said second of said plurality of switches.

18. The apparatus of claim 17 wherein, said first and second drivers are further actuable to clear or reset the first switch by supplying fourth and fifth drive signals thereto, said fourth drive signal comprising a negative voltage level over a second interval while said fifth drive signal comprises a positive voltage level during said second interval, and wherein said third driver is actuable to supply a sixth drive signal during said second interval, said sixth drive signal comprising a pulse train which alternates between a positive and negative voltage level during said second interval.

* * * * *